United States Patent
Onozuka et al.

(10) Patent No.: US 10,422,936 B2
(45) Date of Patent: Sep. 24, 2019

(54) LIGHTING DEVICE

(71) Applicant: NICHIA CORPORATION, Anan-shi, Tokushima (JP)

(72) Inventors: Katsuyuki Onozuka, Nagano (JP); Yoshitaka Tanaka, Suwa (JP)

(73) Assignee: NICHIA CORPORATION, Anan-Shi (JP)

(*) Notice: Subject to any disclaimer, the term of this patent is extended or adjusted under 35 U.S.C. 154(b) by 188 days.

(21) Appl. No.: 15/720,961

(22) Filed: Sep. 29, 2017

(65) Prior Publication Data
US 2018/0095214 A1 Apr. 5, 2018

(30) Foreign Application Priority Data
Sep. 30, 2016 (JP) ................. 2016-1950040

(51) Int. Cl.
| | |
|---|---|
| *F21K 9/20* | (2016.01) |
| *G02B 6/42* | (2006.01) |
| *F21V 8/00* | (2006.01) |
| *G02B 6/26* | (2006.01) |
| *F21K 9/64* | (2016.01) |
| *G02B 6/02* | (2006.01) |
| *H01S 5/02* | (2006.01) |
| *F21Y 115/30* | (2016.01) |

(52) U.S. Cl.
CPC ............ *G02B 6/001* (2013.01); *F21K 9/20* (2016.08); *G02B 6/0003* (2013.01); *G02B 6/264* (2013.01); *G02B 6/4204* (2013.01); *F21K 9/64* (2016.08); *F21Y 2115/30* (2016.08); *G02B 6/02319* (2013.01); *H01S 5/02* (2013.01)

(58) Field of Classification Search
CPC ........... F21K 9/20; G02B 6/42; G02B 6/4204; G02B 6/264
See application file for complete search history.

(56) References Cited

U.S. PATENT DOCUMENTS 8,724,941 B2 * 5/2014 Reever ................... A61B 18/24
385/31

FOREIGN PATENT DOCUMENTS

| JP | H07-125574 A | 5/1995 |
|---|---|---|
| JP | 2000-275444 A | 10/2000 |

(Continued)

*Primary Examiner* — Sung H Pak
*Assistant Examiner* — Hoang Q Tran
(74) *Attorney, Agent, or Firm* — Foley & Lardner LLP

(57) ABSTRACT

A lighting device includes an optical fiber having a first end portion from which a light emitted by a light source is introduced, and a second end portion, the optical fiber allowing the light to pass therethrough while radiating from a side surface of the optical fiber to an outside; a tube having light-transmissivity and covering the side surface of the optical fiber, such that a gap is located between the side surface of the optical fiber and the tube; a light-shielding cylindrical body covering the second end portion of the optical fiber, such that a space is located between the second end portion of the optical fiber and the cylindrical body, at least a portion of the light-shielding cylindrical body being disposed in the tube; and a light conductive part on a side surface of the cylindrical body, the light conductive part allowing light radiated from the second end portion of the optical fiber to be conducted to a portion of the tube at an outside of the cylindrical body in a diametrical direction of the cylindrical body.

18 Claims, 2 Drawing Sheets

(56) References Cited

FOREIGN PATENT DOCUMENTS

| JP | 2005-025979 A | 1/2005 |
|---|---|---|
| JP | 2012-099284 A | 5/2012 |
| JP | 2013-229174 A | 11/2013 |
| JP | 2014-534565 A | 12/2014 |
| WO | WO-2012/165346 A1 | 12/2012 |

\* cited by examiner though only light having an angle equal to or smaller than a critical angle by Snell's law is totally reflected in an interface between the core and the cladding, the other light is refracted in the interface between the core and the cladding and radiated from the side surface of the optical fiber 80 to the outside.

LIGHTING DEVICE

CROSS-REFERENCE TO RELATED APPLICATIONS

The present application claims priority to Japanese Patent Application No. 2016-195040, filed on Sep. 30, 2016, the disclosure of which is hereby incorporated by reference in its entirety.

TECHNICAL FIELD

The present disclosure relates to a lighting device.

BACKGROUND

Optical fiber has been used for a lighting device. For example, Japanese Patent Publication No. 2014-534565 discloses a laser diode used as a light source. Light emitted by the laser diode is conducted by a light diffusing fiber. A phosphorescent material around the light diffusing fiber is exited in a coating layer. Thereby, a light system diffusing light like rod is provided. The lighting system has a mirror on the end of light diffusing fiber to reflect the light.

Japanese Patent Publication No. 2000-275444 discloses a lighting device in which a reflection membrane is formed on the surface of the end of an optical fiber. The reflection membrane reflects the beam emitted by a laser diode on the surface of the end of the optical fiber like the mirror of JP2014-534565 to return the light back to the laser diode side.

SUMMARY

As the JP2014-534565 and JP2000-275444 disclose, a device having a mirror on the top surface of a light diffusing fiber is conventionally known. The mirror reflects the light from laser diode and decreases light energy on the top surface of the optical fiber. However, while output power of a conventional laser diode was several tens of mW, more recently, output has increased to about 3 W, for example. As the output power of the laser diode has increased, the energy density of light on the top surface of the light diffusing fiber has increased from about 0.013 kW/cm$^2$ to about 1.5 kW/cm$^2$.

This might cause additional material to absorb light and its temperature to become very high when dust, soil or the like adheres in small crevices or spaces between the top of optical fiber and the mirror. The added material might become hot, and devices arranged near the optical fiber or the optical fiber itself might degrade. Certain embodiments according to the present disclosure are intended to provide a lighting device with decreased degradation of component parts.

In one embodiment, a lighting device includes: an optical fiber having a first end portion from which a light emitted by a light source is introduced, and a second end portion, the optical fiber allowing the light to pass therethrough while radiating from a side surface of the optical fiber to an outside; a tube having light-transmissivity and covering the side surface of the optical fiber with gap between the side surface of the optical fiber and the tube; a light-shielding cylindrical body covering the second end portion of the optical fiber via a space between the second end portion of the optical fiber and the cylindrical body, at least a portion of the light-shielding cylindrical body being disposed in the tube; and a light conductive part on a side surface of the cylindrical body, the light conductive part allowing a light radiated from the second end portion of the optical fiber to be conducted to a portion of the tube at an outside of the cylindrical body in a diametrical direction of the cylindrical body.

The lighting device concerning the present disclosure can decrease degradation of component parts.

DETAILED DESCRIPTION

Figure 1:
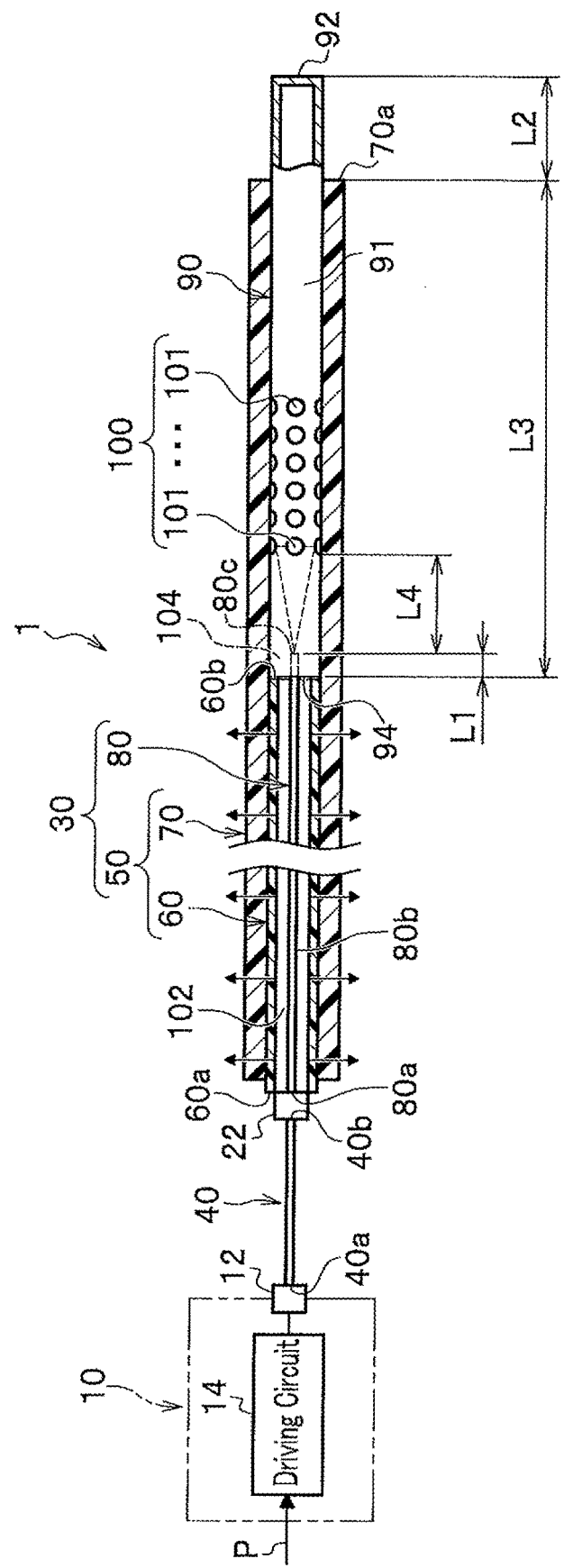
FIG. 1 is a schematic sectional view showing a total component of lighting system including the lighting device concerning the embodiment.
Figure 2:
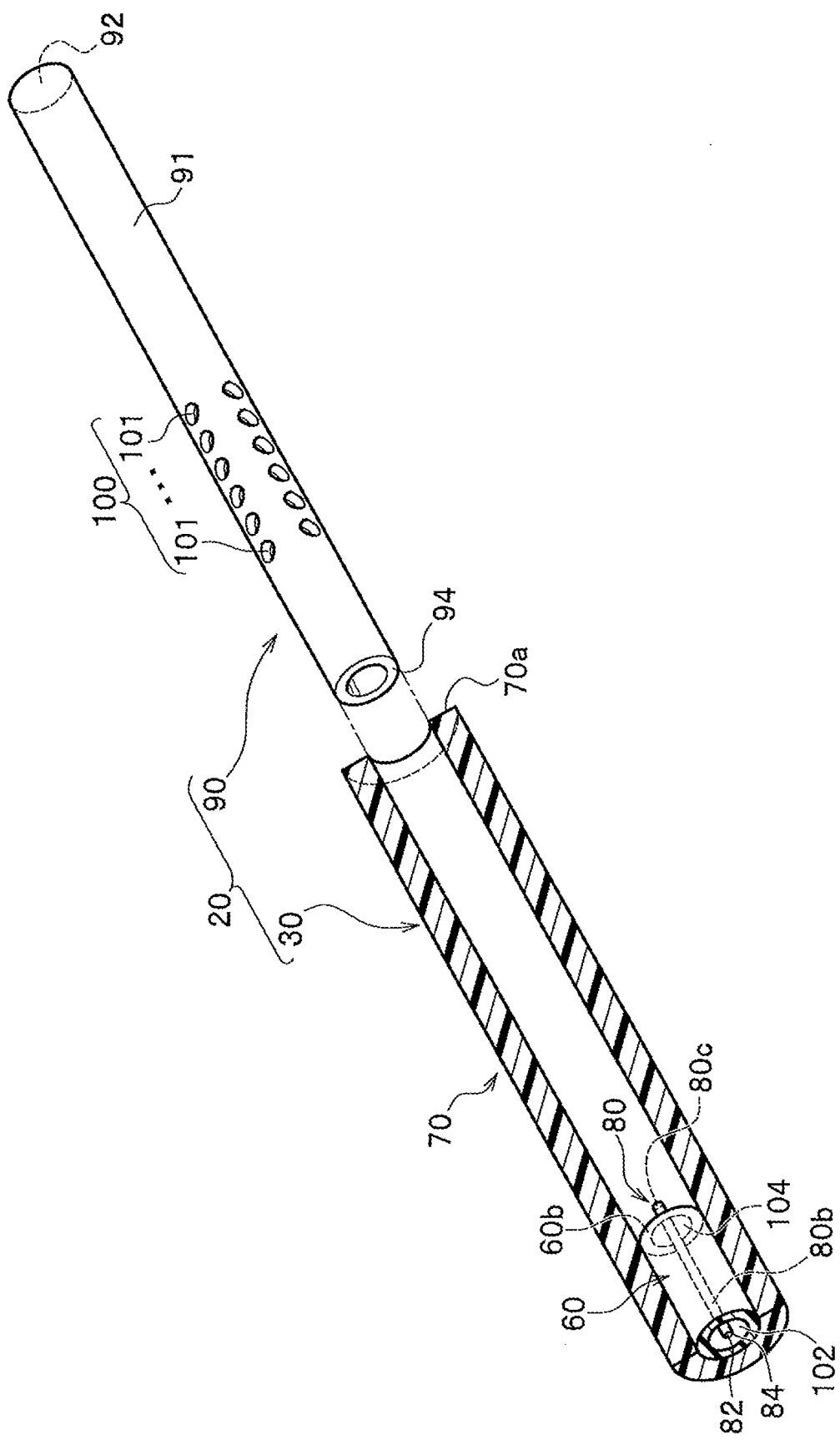
FIG. 2 is a disassembled perspective view showing main component of the lighting device concerning the embodiment.

Embodiments of the present application will be disclosed below with reference to the drawings. A lighting system including a lighting device according to the one embodiment will be described with reference to FIG. 1 and FIG. 2. Note, the following embodiments are exemplary, and the present invention is not limited thereto. Further, the scale, material, shape and relative arrangement of the component members disclosed in the embodiments are only exemplary, and do not limit the present invention unless explicitly stated. The size and positional relationships of members shown in the drawings may be exaggerated for clarity. Further, the following disclosure uses the same name and the same reference numeral for the same members or the same materials, and repetition of detailed explanation may be omitted where appropriate.

A lighting device 1 of one embodiment includes a light emitting member 30, that introduces light from a light source 12 through a light guide fiber 40 to emit light, and a cylindrical body 90 inserted in the light emitting member 30.

The light source 12 is a light emitting semiconductor device such as a laser diode that emits a laser beam using electric power P from outside of the light source 12. Further, the light source 12 is included as a part of light generating device 10, which emits a light beam using inputted electric power from a driving circuit 14. The light source 12 is connected to a first end portion 40*a* of light guide fiber 40. A second end portion 40*b* of the light guide fiber 40 is connected to a connector 22. Further, light emitted from the light source 12 is introduced to the light emitting member 30 through the light guide fiber 40 and connector 22.

The light emitting member 30 includes a light-transmissive tube 50 and an optical fiber 80. For example, here, the tube 50 has double structure of a light-transmissive tube 60 and phosphorescent tube 70. The connector 22 connects the light guide fiber 40 and optical fiber 80 of the light emitting member 30, sending a light beam from the light guide fiber 40 to the optical fiber 80. The structure of the connector 22 is not limited, as long as light from the second end portion 40*b* of the light guide fiber 40 can be inputted into the first end portion 80*a* of the optical fiber The optical fiber 80 is light diffusing fiber that emits light from its side to an area outside of the fiber 80. The optical fiber 80 primarily includes a core 82 and a cladding 84. The core 82, which mainly consists of quarts glass, is made to conduct light in the axial direction. Further, the cladding 84 is a light diffusing layer, which is made of a resin material cladding the outer surface of the core 82. The cladding 84 has refraction factor different from that of the core 82, and the cladding 84 has light-transmissivity and can diffuse the light traveling through the core 82 in the radially outward direction to radiate from the side 80b to an outside of the optical fiber 80.

Further, the optical fiber 80 receives light generated by the light generator 10 from the first end portion 80a of the fiber and radiates light from the second end portion 80c of the fiber. At the same time, the optical fiber 80 radiates light from the side 80b during light guiding inside of the optical fiber. The light that is radiated from the side 80b of the optical fiber 80 permeates through an inner light-transmissive tube 60 covering the optical fiber 80 via a gap 102, reaches phosphorescent material of an outer phosphorescent tube 70 and excites the phosphorescent material. As a result, the light emitting member 30 lights the tube 50 by both the light from the optical fiber 80 and the light from the phosphorescent material.

Further, the light that is guided through the optical fiber 80 is radiated from the second end portion 80c of the optical fiber to the outside of the tube. However, energy density of light is high around the second end portion 80c of the fiber. Therefore, the tube 50 may be damaged, showing blackening and burning, when the second end portion 80c touches the tube 50 or radiates light that has higher energy than the tube 50 can resist. The light-transmissive tube 60 and the phosphorescent tube 70 are arranged in a position such that light is not directly radiated on them from the second end portion 80c of the fiber to prevent damage of the tube 50. The light-transmissive tube 60 and the phosphorescent tube 70 are preferably separated from the second end portion 80c of the optical fiber 80 by some distance. The second end portion 80c of the optical fiber 80 protrudes from the opposite end 60b of the light-transmissive tube 60 and is arranged inside of the cylindrical body 90.

The second end portion 80c of the optical fiber 80 protrudes by a predetermined distance L1 from the position of the opposite end 60b of the light-transmissive tube 60 insides of the cylindrical body 90. The distance L1 by which the second end portion 80c protrudes from the end 60 b is set so that the light radiated from the second end portion 80c of the optical fiber 80 is not irradiated to the end 60b of the light-transmissive tube 60. The distance L1, here, is preferably set to be 0.1 to several centimeters considering deformation of the light emitting member 30, etc.

Light conversion efficiency of phosphorescence decreases as temperature rises in the phosphorescent tube 70. Thereby, between the second end portion 80c of the optical fiber 80 and the phosphorescent tube 70, the gap 102 and the light-transmissive tube 60 are arranged so that the optical fiber 80 is inhibited from touching the phosphorescent tube 70 and so that heat of the optical fiber 80 can is inhibited from being conducted to the phosphorescent tube 70.

The tube 50 includes the light-transmissive tube 60 as an inner tube and the phosphorescent tube 70 as an outer tube. The light-transmissive tube 60 covers the side 80b of the optical fiber 80, with the gap 102 between the side 80b and the light-transmissive tube 60. Further, the light-transmissive tube 60, which has a higher light-transmissivity than the phosphorescent tube 70, is arranged between the optical fiber 80 and the phosphorescent tube 70 and an inner side of the phosphorescent tube 70. The light-transmissive tube 60 is arranged so that the end 60a connects to a connector 22 and is supported by the connector 22, and so that the opposite end 60b faces the cylindrical body 90. Further, the light-transmissive tube 60 is slightly shorter than the optical fiber 80 and is made of a light-transmissive material such as polyvinyl chloride resin etc., which has light-transmissivity.

The light-transmissive tube 60 is shorter than the phosphorescent tube 70 and a there is a difference in length between the opposite end 60b and an end of phosphorescent tube 70. The light-transmissive tube 60 acts as a protecting tube, which inhibits breakage of the optical fiber 80. In the location of the length difference between the light-transmissive tube 60 and the phosphorescent tube 70, the cylindrical body 90, which will be described in detail later, is inserted.

The phosphorescent tube 70 has light-transmissivity and covers the side 80b of the optical fiber 80, with the gap 102 between the side 80b of the optical fiber 80 and the phosphorescent tube 70. The phosphorescent tube 70 covers the light-transmissive tube 60 and is longer than the light-transmissive tube 60. The light-transmissive tube 60 covers the optical fiber 80, with the gap 102 between the light-transmissive tube 60 and the optical fiber 80. Further, the phosphorescent tube 70 acts as a protecting tube, which inhibits breakage of the optical fiber 80 regardless of the presence of the light-transmissive tube 60. Further, the phosphorescent tube 70 includes phosphorescent material, which is excited by the light emitted from the side 80b of the optical fiber 80. The phosphorescent tube 70 can be made of flexible resin material or a rigid glass material. For example, the resin material can be silicone resin, epoxy resin, phenol resin, polycarbonate resin, acryl resin, TPX resin, polynorbornene resin, denatured resins of these resins or hybrid resin. Further, for example, the glass material can be borosilicate glass, quarts glass, sapphire glass, calcium fluoride glass, alumino-borosilicate glass, oxynitride glass, chalcogenide glass etc.

Further, the phosphorescent material included in the phosphorescent tube 70 can be selected from the phosphorescent materials appropriately used in this technological field. The phosphorescent materials that a blue light emitting device or a ultraviolet light emitting device can excite are nitride based phosphorescent materials, for example, Yttrium Aluminum Garnet phosphorescent material activated by Serium (YAG:Ce), Lutetium Aluminum Garnet phosphorescent material activated by Serium (LAG:Ce), nitrogen including Calcium Alumino silicate activated Europium and/or Chromium ($CaO-Al_2O_3-SiO_2$:Eu), Silicate phosphorescent material activated by Europium (($Sr, Ba)_2SiO_4$:Eu), β—Sialon phosphorescent material, CASN phosphorescent material ($CaAlSiN_3$:Eu), SCASN phosphorescent material ((Sr, Ca)$AlSiN_3$:Eu), etc., KSF phosphorescent material ($K_2SiF_6$: Mn), sulfide based phosphorescent material and quantum dot phosphorescent material. The combination of these phosphorescent materials and blue light emitting device or ultraviolet light emitting device can radiate various colors. Further, concentration of the phosphorescent materials included in the phosphorescent tube 70 is for example about 5~50 weight %.

The cylindrical body 90 is inserted in the inside of the opposite end of the phosphorescent tube 70. The cylindrical body 90 decreases the influence of heat converted from light of the optical fiber 80. At the same time, a light conductive member 100 of the cylindrical body 90 radiates the light from optical fiber 80 to the phosphorescent tube 70. The cylindrical body 90 has cylindrical side 91, an open end 94 opening one end and a closed end 92 closing the opposite end like cup. Further, the cylindrical body 90 has the light conductive member 100, which conducts the light radiated form the second end portion 80c of the optical fiber 80 to the phosphorescent tube 70 situated on the radial outer surface of the cylindrical body 90, on the side wall 91. The light conductive member 100 includes holes 101 penetrating radially the side surface 91 of the cylindrical body, specifically the light conductive member 100 includes plural holes 101 on the side surface 91. The cylindrical body 90 has light shielding property and space 104 between the second end portion 80*c* of the optical fiber 80 and the cylindrical body 90. The second end portion 80*c* of the optical fiber 80 is covered by the cylindrical body 90. The cylindrical body 90 is made of, for example, metal material that has light shielding property. The cylindrical body 90 is made of, for example, aluminum, aluminum alloy, silver, other metal like copper, alloy of these metals or other material like ceramics with good heat resistance etc. Further, when the cylindrical body 90 is made of aluminum or aluminum alloy, its absorbance of blue light (wave length is around 450 nm.) is lower than other metal or other metal alloy. Reduction of light intensity insides of the cylindrical body 90 is suppressed, and light radiating from holes 101 to outsides can be used efficiently. Further, aluminum or aluminum alloy has good heat conductivity, good heat diffusion and radiation effect are supposed. Further, its processability is good and aspect quality of the lighting device 1 will not be damaged.

The side surface 91 of the cylindrical body 90 has almost the same outer diameter size as the light-transmissive tube 60. Further, the cylindrical body 90 is inserted from the end 70*a* of the phosphorescent tube 70 so that the closed end 92 protrudes from the end 70*a* of the phosphorescent tube 70. The closed 92 of the cylindrical body 90 protrudes by predetermined distance L2 from the end 70*a* in the axial direction. As a result, a inside surface of the closed surface 92, which faces the second end portion 80*c*, has enough distance from the end of 80*c*. Therefore, when light is directly radiated from the second end portion 80*c* of the optical fiber 80, energy density of the light that reaches the inner surface of the closed end 92 will not increase. Further, a part of side surface 91 and the closed end 92 of the cylindrical body 90 are not covered with the phosphorescent tube 70 and are exposed to outside. Thereby, an increase in temperature of the phosphorescent tube 70 due to higher radiation can be inhibited.

Plural holes 101 of the light conductive member 100 are arranged on a part of side surface 91 where the cylindrical body 90 and the phosphorescent tube 70 overlap each other. The plural holes 101 are arrayed radially. Further, the holes 101 are circular holes of the same diameter and the same size, which are arranged with the same distance in the circumferential direction of the side surface 91 and at the same time in the axial direction. Further, the plural holes 101 that are arranged at the nearest position from the second end portion 80*c* of the optical fiber 80 are separated by a predetermined distance L4 in the axial direction. The distance L4 should be preferably determined so that the phosphorescent tube 70 will not be deteriorated by the energy density of the light when radiated from the second end portion 80*c* through holes 101 with the distance L4.

Further, the shape of the plural circular holes 101 arranged on the cylindrical body 90 is not specially limited to circle. For example, an ellipse, a quadrangle etc. and any other kind of shape can be used when the holes are arranged on the side surface 91 of the cylindrical body 90 and conduct light radiated from the second end portion 80*c* of optical fiber 80 to the phosphorescent tube 70, which is radially outside of the cylindrical body 90. Further, different sizes of holes can be arranged in plural rows, and arrangement can be irregularly determined and holes of any size can be combined and shape, number and arrangement of the hole 101 are not specially limited.

The cylindrical body 90 is inserted from the end 70*a* opposite to the light source 12 of the phosphorescent tube 70. In the phosphorescent tube 70, the opposite end 60*b* of the light-transmissive tube 60 faces the open end 94. The position where the opposite end 60*b* of the light-transmissive tube 60 faces the open end 94 is near to the end 70*a* opposite to the light source 12 in the phosphorescent tube 70. Here, the length of the part of the cylindrical body 90 that is inserted into the phosphorescent tube 70 (in other words, the size of the part where the cylindrical body 90 overlaps the phosphorescent tube 70) is L3. In the length L3, a space is formed between the second end portion 80*c* of the optical fiber 80 and the closed end 92 of the cylindrical body 90 so that heat generated by the cylindrical body 90's absorbing the light that is radiated from the second end portion 80*c* of the optical fiber 80 does not cause light conversion efficiency of the phosphorescent tube 70 to be low and does not causephysical degradation.

The second end portion 80*c* of the optical fiber 80 protrudes by length L1 from the end 60*b* of the light-transmissive tube 60 in the state of being inserted into the cylindrical body 90 from the open end 94 so that the protruding second end portion 80*c* of the optical fiber 80 will remain in the cylindrical body 90 when the second end portion 80*c* of the optical fiber 80 moves. The gap 102 is made around the optical fiber 80 between the light-transmissive tube 60 and the optical fiber 80. In the cylindrical body 90, the light radiated from the optical fiber 80 is absorbed by the cylindrical body 90 in the space 104. Components other than the light conductive member 100 are not directly radiated with light inside of the phosphorescent tube 70. Further, the closed end 92 of the cylindrical body 90 is closed and separated from the second end portion 80*c* of the optical fiber 80. As a result, the light radiated by the optical fiber 80 does not leak out from the closed end 92 to axial direction and the laser beam does not leak out when the laser beam is used as the light source, to maintain safety.

Next, operation of lighting device 1 will be described. In the lighting device 1, light is radiated from the light source 12, conducted through the light guide fiber 40, and conducted from the connector 22 to the light emitting member 30. In the light emitting member 30, a part of the light is radiated from the side surface 80*b* of the optical fiber 80 to an outside when conducted through the optical fiber 80 and excites the phosphorescent material in the phosphorescent tube 70 around the light-transmissive tube 60.

On the other hand, a part of the light conducted to the optical fiber 80 is conducted through the core 82 and is radiated from the second end portion 80*c* to the space 104 in the cylindrical body. The light radiated from the second end portion 80*c* of the optical fiber 80 is irradiated to the inside surface of the side surface 91 and the closed end 92 through the space 104.

The cylindrical body 90 inserted between the second end portion 80*c* of the optical fiber 80 and the phosphorescent tube 70 is made of aluminum or aluminum alloy, which has light blocking effect, blocks the light from the second end portion 80*c* so as not to let the light directly reach the phosphorescent tube 70 and a different part of the side surface 91 from the light conductive member 100. Further, high energy density light at the second end portion 80*c* is not irradiated to the light-transmissive tube 60 and the phosphorescent tube 70, so that degradation of the tubes is inhibited.

Further, in the light conductive member 100, the light radiated from the second end portion 80*c* directly irradiates or irradiates with one to several reflections on the inner edge of hole 101 to an outside of the cylindrical body 90 and reaches the phosphorescent tube 70. The phosphorescent material included in the phosphorescent tube 70 is excited by the light from the holes 101 and emits light. The phosphorescent material 30 is dispersed in the phosphorescent tube 70, which is an outer layer of the tube 50. Therefore the whole tube 50 emits light.

Further, the distance from the second end portion 80c of the optical fiber 80 to the nearest hole 101 on the light conductive member 100 is axial distance L4. Therefore, the light from the second end portion 80c widens over the distance L4 and the energy density in the area of holes 101 can decrease.

Further, the cylindrical body 90 is made of heat conductive metal, for examples, aluminum or aluminum alloy. Thereby heat dissipation of the cylindrical body 90 is good and the possibility that a member around the optical fiber 80 such as the tube 50 or the optical fiber 80 itself degrades because of heat accumulation will decrease.

Further, the optical fiber 80 and the light conductive member 100 are covered by one phosphorescent tube 70. The phosphorescent tube 70 includes an axially homogeneous amount of phosphorescent material. By using the optical fiber 80 that has an axially homogeneous diffusion ratio, the phosphorescent material emits light by using the light radiated from the light conductive member 100. This makes it possible to provide light with an substantially homogeneous power and color without irregularity.

Further, as described above, the second end portion 80c of the optical fiber 80 protrudes by the predetermined length L1. Therefore, the light radiated from the second end portion 80c of the optical fiber 80 does not directly expose the end 60b of the light-transmissive tube 60. Further, the second end portion 80c of the optical fiber 80 is positioned inside of the cylindrical body 90. Therefore, the light radiated from the second end portion 80c of the optical fiber 80 that is inserted by the length L1 into the cylindrical body 90 is blocked by the side surface 91 of the cylindrical body 90 when an area other than the hole 101 is radiated, and the light cannot be radiated to outside of the cylindrical body 90. Further, the light conducted into the hole 101 of the light conductive member 100 excites the phosphorescent material included in the outer phosphorescent tube 70 in the same manner as the light radiated from the side surface 80b of the optical fiber 80. Therefore, the lighting device 1 of this lighting system prevents a laser beam of high energy density from leaking, can increase safety, and can decrease degradation of component members such as blackening of the tube 50 and maintain the external appearance of the lighting device in good condition.

Further, a tube having multiple structures, such as two, three or more structures, can be used for the tube 50 of the lighting device 1. The light-transmissive tube 60 is not required. Further, the cylindrical body 90 does not require the length L4 from the second end portion 80c of the optical fiber 80 to the nearest hole 101. Further the closed end 92 of the cylindrical body 90 axially protrudes by the predetermined size L2 from the end 70a of the phosphorescent tube 70. But the closed end 92 does not need to protrude. That is, the cylindrical body 90 can be inside of the end 70a of the phosphorescent tube 70 or can be as long as the phosphorescent tube 70 when inserted into the tube 50. Further, the holes 101 on the side surface 91 of the cylindrical body 90 can be made on a part of or all of its surface that overlaps the phosphorescent tube 70. Further, the lighting device 1 can have a space or no space between the light-transmissive tube 60 and the phosphorescent tube 70.

The lighting devices of the present disclosure can be used as, for example, backlight sources of liquid crystal displays, various lighting devices, large size displays, various displays for advertisements, guides etc., digital video cameras, facsimiles, copy machines, image reading apparatuses of scanners etc., projector apparatuses, or light sources of various apparatus.

REFERENCE NUMERAL LIST 1 lighting device
10 light generating device
12 light source
30 light emitting member
50 tube
60 light-transmissive tube
60a end of light-transmissive tube
60b end of light-transmissive tube
70 phosphorescent tube
70a end of phosphorescent tube
80 optical fiber
80a first end portion of optical fiber
80b side surface of optical fiber
80c second end portion of optical fiber
82 core
84 cladding
90 cylindrical body
91 side surface of cylindrical body
92 closed end
94 open end
100 light conductive member
101 hole
102 gap
104 space

What is claimed is:

1. A lighting device comprising:
   an optical fiber having a first end portion from which a light emitted by a light source is introduced, and a second end portion, the optical fiber allowing the light to pass therethrough while radiating from a side surface of the optical fiber to an outside;
   a tube having light-transmissivity and covering the side surface of the optical fiber, such that a gap is located between the side surface of the optical fiber and the tube;
   a light-shielding cylindrical body covering the second end portion of the optical fiber, such that a space is located between the second end portion of the optical fiber and the cylindrical body, at least a portion of the light-shielding cylindrical body being disposed in the tube; and
   a light conductive part on a side surface of the cylindrical body, the light conductive part allowing light radiated from the second end portion of the optical fiber to be conducted to a portion of the tube at an outside of the cylindrical body in a diametrical direction of the cylindrical body.

2. The lighting device according to claim 1, wherein an end portion of the cylindrical body that is farther from the second end portion of the optical fiber is closed.

3. The lighting device according to claim 2, wherein the light conductive part defines holes that extend through the side surface of the cylindrical body in the diametrical direction of the cylindrical body.

4. The lighting device according to claim 1, wherein the cylindrical body is made of aluminum or aluminum alloy.

5. The lighting device according to claim 2, wherein the cylindrical body is made of aluminum or aluminum alloy.

6. The lighting device according to claim 3, wherein the cylindrical body is made of aluminum or aluminum alloy.

7. The lighting device according to claim 1, wherein the tube comprises a phosphorescent tube including phosphorescent material adapted to be excited by light radiated from the side surface of the optical fiber.

8. The lighting device according to claim 2, wherein the tube comprises a phosphorescent tube including phosphorescent material adapted to be excited by light radiated from the side surface of the optical fiber.

9. The lighting device according to claim 3, wherein the tube comprises a phosphorescent tube including phosphorescent material adapted to be excited by light radiated from the side surface of the optical fiber.

10. The lighting device according to claim 4, wherein the tube comprises a phosphorescent tube including phosphorescent material adapted to be excited by light radiated from the side surface of the optical fiber.

11. The lighting device according to claim 5, wherein the tube comprises a phosphorescent tube including phosphorescent material adapted to be excited by light radiated from the side surface of the optical fiber.

12. The lighting device according to claim 6, wherein the tube comprises a phosphorescent tube including phosphorescent material adapted to be excited by light radiated from the side surface of the optical fiber.

13. The lighting device according to claim 7,
wherein the tube further comprises a light-transmissive tube covering the optical fiber, with the gap located between the side surface of the optical fiber and the second light-transmissive tube at an inner side of the phosphorescent tube, and
wherein the second end portion of the optical fiber protrudes from an end portion of the second transmissive tube.

14. The lighting device according to claim 8,
wherein the tube further comprises a light-transmissive tube covering the optical fiber, with the gap located between the side surface of the optical fiber and the second light-transmissive tube at an inner side of the phosphorescent tube, and
wherein the second end portion of the optical fiber protrudes from an end portion of the second transmissive tube.

15. The lighting device according to claim 9,
wherein the tube further comprises a light-transmissive tube covering the optical fiber, with the gap located between the side surface of the optical fiber and the second light-transmissive tube at an inner side of the phosphorescent tube, and
wherein the second end portion of the optical fiber protrudes from an end portion of the second transmissive tube.

16. The lighting device according to claim 10,
wherein the tube further comprises a light-transmissive tube covering the optical fiber, with the gap located between the side surface of the optical fiber and the second light-transmissive tube at an inner side of the phosphorescent tube, and
wherein the second end portion of the optical fiber protrudes from an end portion of the second transmissive tube.

17. The lighting device according to claim 11,
wherein the tube further comprises a light-transmissive tube covering the optical fiber, with the gap located between the side surface of the optical fiber and the second light-transmissive tube at an inner side of the phosphorescent tube, and
wherein the second end portion of the optical fiber protrudes from an end portion of the second transmissive tube.

18. The lighting device according to claim 12,
wherein the tube further comprises a light-transmissive tube covering the optical fiber, with the gap located between the side surface of the optical fiber and the second light-transmissive tube at an inner side of the phosphorescent tube, and
wherein the second end portion of the optical fiber protrudes from an end portion of the second transmissive tube.

* * * * *